United States Patent
Kanda et al.

(10) Patent No.: US 8,264,278 B2
(45) Date of Patent: Sep. 11, 2012

(54) AMPLIFIER

(75) Inventors: Kouichi Kanda, Kawasaki (JP); Takuji Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 27 days.

(21) Appl. No.: 12/708,972

(22) Filed: Feb. 19, 2010

(65) Prior Publication Data

US 2010/0253436 A1    Oct. 7, 2010

Related U.S. Application Data

(63) Continuation of application No. PCT/JP2007/000892, filed on Aug. 21, 2007.

(51) Int. Cl.
*H03F 3/60* (2006.01)

(52) U.S. Cl. ............... 330/286; 330/310; 330/124 R; 330/54; 330/295

(58) Field of Classification Search ............... 330/54, 330/124 R, 286, 295, 310
See application file for complete search history.

(56) References Cited

U.S. PATENT DOCUMENTS

| 5,550,513 | A | 8/1996 | Wong | |
|---|---|---|---|---|
| 6,597,243 | B1 * | 7/2003 | Fratti | 330/54 |
| 7,129,783 | B2 * | 10/2006 | Young et al. | 330/286 |

| 2003/0169076 | A1 | 9/2003 | Oi et al. | |
|---|---|---|---|---|
| 2005/0088233 | A1 | 4/2005 | Miyashita et al. | |
| 2005/0093628 | A1 * | 5/2005 | Chen | 330/253 |

FOREIGN PATENT DOCUMENTS

| JP | 02-189009 A | 7/1990 |
|---|---|---|
| JP | 05-315851 A | 11/1993 |
| JP | 07-170139 A | 7/1995 |
| JP | 10-510970 A | 10/1998 |
| JP | 2003-258624 | 9/2003 |
| JP | 2005-136453 A | 5/2005 |

OTHER PUBLICATIONS

Sherif Galal et al., "40Gb/s Amplifier and ESD Protection Circuit in 0.18μm CMOS Technology", Feb. 18, 2004; 2004 IEEE International Solid-State Circuits Conference; ISSCC 2004/ Session 26/ Optical and Fast I/O / 26.6;University of California, Los Angeles, CA.
International Preliminary Report dated Mar. 4, 2010, 13 pages.

* cited by examiner

*Primary Examiner* — Hieu Nguyen
(74) *Attorney, Agent, or Firm* — Arent Fox LLP (57) ABSTRACT

An amplifier is realized by a distributed-constant-type amplifier including an input-side transmission line and an output-side transmission line, and a plurality of unit circuits coupled between the input-side transmission line and the output-side transmission line, in which each of the plurality of unit circuits is formed by including an amplification circuit having a gain equal to or greater than one.

9 Claims, 10 Drawing Sheets

AMPLIFIER

CROSS-REFERENCE TO RELATED APPLICATION

This application is a Continuation Application of International Application No. PCT/JP2007/000892, filed Aug. 21, 2007, designating the U.S., the entire contents of which are incorporated herein by reference.

FIELD

The embodiments discussed herein are related to an amplifier used.

BACKGROUND

An amplifier is one of circuit elements widely required in LSIs of any type. Two types of amplifiers are mainly known as a wide-band amplifier used to perform amplification or transmission of high-speed signals. One is an amplifier that utilizes an inductor peaking (a technique for realizing a widening of a band by using an inductor), and the other one is an amplifier that utilizes a wide-band characteristic of a transmission line. As a typical example of the amplifier that utilizes the wide-band characteristic of the transmission line, a distributed-constant-type amplifier can be cited.

Figure 8:
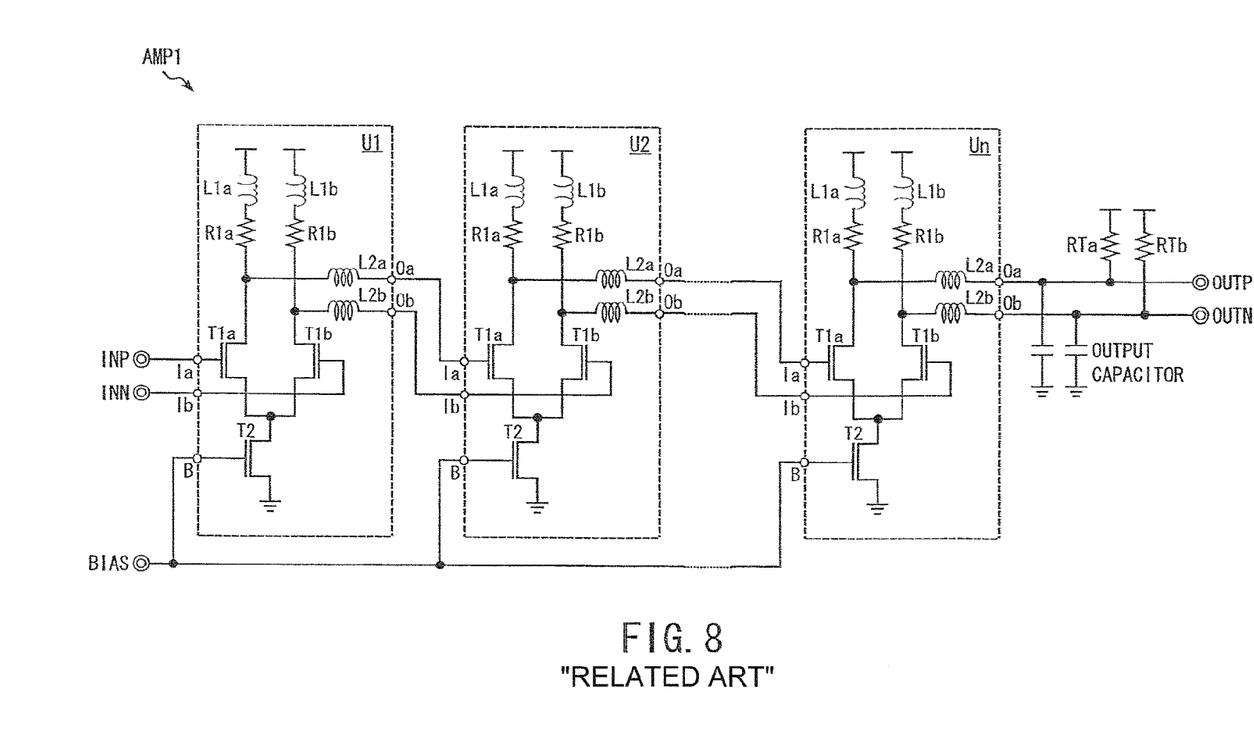
FIG. 8 is an explanatory diagram illustrating a first example of the amplifier.

FIG. 8 illustrates a first example of the amplifier. An amplifier AMP1 is formed by coupling a plurality of stages of unit circuits U1 to Un in order to obtain a desired gain by an entire amplifier or to obtain a current driving capability that is required in an output part. Input terminals Ia, Ib (gates of transistors T1$a$, T1$b$) of the unit circuit U1 are coupled to input terminals INP, INN of the amplifier AMP1. Output terminals Oa, Ob (terminals of inductors L2$a$, L2$b$) of the unit circuit U1 (U2 to Un−1) are coupled to input terminals Ia, Ib of the unit circuit U2 (U3 to Un). Output terminals Oa, Ob of the unit circuit Un are coupled to output terminals OUTP, OUTN of the amplifier AMP1. Bias terminals B (gates of transistors T2) of the unit circuits U1 to Un are coupled to a bias terminal BIAS of the amplifier AMP1. To the output terminals OUTP, OUTN of the amplifier AMP1, terminating resistors RTa, RTb are coupled.

The unit circuit Ui (i=1, 2, . . . , n) is a TRA (Triple-Resonance Amplifier) type differential amplification circuit formed by applying an inductor peaking to a resistance-load-type differential amplification circuit being the most common differential amplification circuit. More specifically, the unit circuit Ui is formed as a resistance-load-type differential amplification circuit formed of differential pair transistors T1$a$, T1$b$, a current source transistor T2, and load resistors R1$a$, R1$b$, in which peaking inductors L1$a$, L1$b$ are inserted between the resistors R1$a$, R1$b$ and a power line, and peaking inductors L2$a$, L2$b$ are coupled to connection nodes of the transistors T1$a$, T1$b$ and the resistors R1$a$, R1$b$. The inductor peaking is the most effective method for realizing a widening of a band of a differential amplification circuit, and in theory, it is possible to widen the band by about 3.5 times by applying the inductor peaking, when compared with a case where no inductor peaking is applied.

Figure 9A:
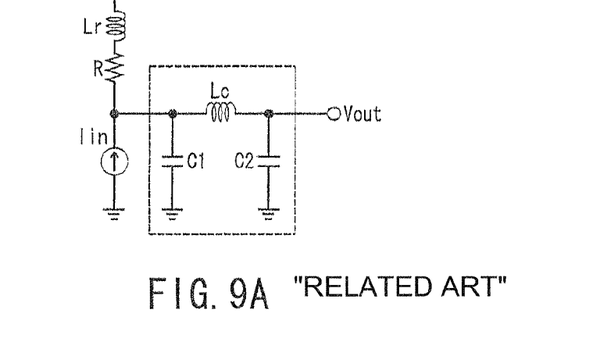
FIGS. 9A, 9B, and 9C are explanatory diagrams illustrating problems in a TRA-type differential amplification circuit.
Figure 9B:
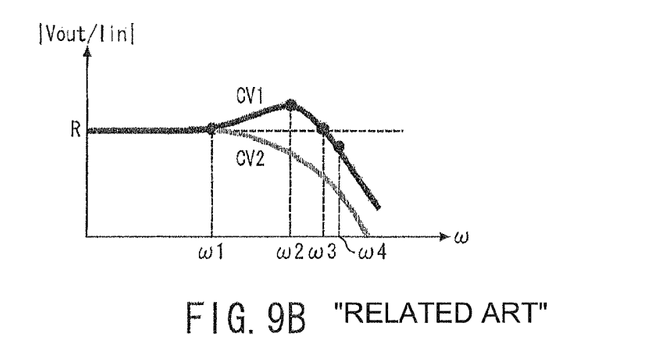
Figure 9C:
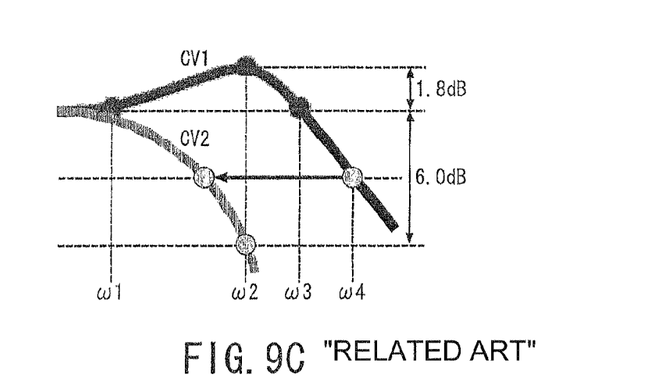

FIGS. 9A, 9B, and 9C illustrate problems in the TRA-type differential amplification circuit. Note that FIG. 9A illustrates an equivalent circuit of the unit circuit (TRA-type differential amplification circuit) in FIG. 8. FIG. 9B illustrates gain-frequency characteristics of the equivalent circuit in FIG. 9A. FIG. 9C illustrates a substantial part of the gain-frequency characteristics in FIG. 9B. In FIGS. 9B and 9C, a characteristic curve CV1 corresponds to a gain-frequency characteristic when capacitances C1, C2 in the equivalent circuit in FIG. 9A are the same, and a characteristic curve CV2 corresponds to a gain-frequency characteristic when the capacitance C2 is twice the capacitance C1 in the equivalent circuit in FIG. 9A.

A frequency ω2 at which a resonance of an LC circuit formed of the capacitors C1, C2, and an inductor Lc (a portion surrounded by a dotted line in the equivalent circuit in FIG. 9A) occurs is represented by an expression (1) by using a frequency ω1. Further, an output voltage Vout is represented by an expression (2) by using an input current Iin and a resistance R.

$$\omega 2 = \sqrt{2} \times \omega 1 \tag{1}$$

$$V\text{out} = \sqrt{(3/2)} \times I\text{in} \times R \tag{2}$$

When the capacitances C1, C2 are the same, a gain at the frequency ω2 becomes higher than a DC gain by 1.8 dB, but, when the capacitance C2 is twice the capacitance C1, the gain at the frequency ω2 becomes lower than the DC gain by 6 dB. In other words, when the capacitances C1, C2 are the same, a gain becomes lower than the DC gain by 3 dB at a frequency ω4, but, when the capacitance C2 is twice the capacitance C1, the gain becomes lower than the DC gain by 3 dB at a frequency significantly lower than the frequency ω4.

In order to optimize inductors Lc, Lr in the equivalent circuit in FIG. 9A, the capacitances C1, C2 of both ends of the inductor Lc have to be the same as a prerequisite. For this reason, when there is a need to gradually enlarge a driving capability (transistor size) of the unit circuits U1 to Un toward a rear stage of the circuits in the amplifier AMP1 in FIG. 8, it is not possible to equalize capacitances of both ends of the inductors L2$a$, L2$b$ in each of the unit circuits U1 to Un, resulting in that a desired increase in the band cannot be obtained, which is a problem. If such a limitation exists, a usability as an amplifier is significantly reduced.

Figure 10:
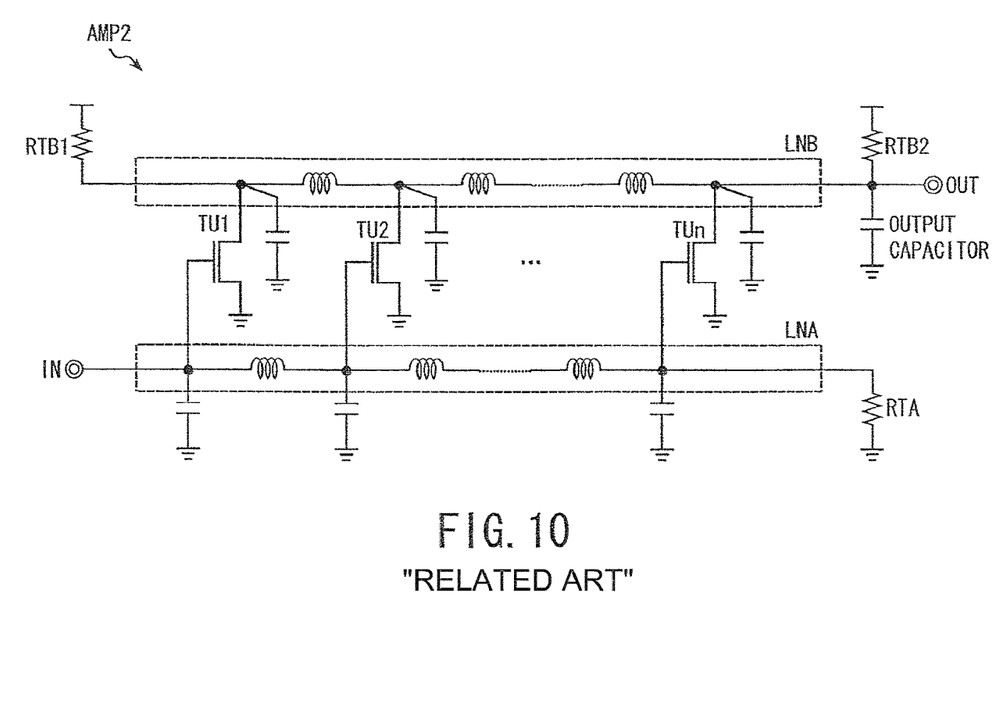
FIG. 10 is an explanatory diagram illustrating a second example of the amplifier.

FIG. 10 illustrates a second example of the amplifier. An amplifier AMP2 is a distributed-constant-type amplifier formed by including an input-side transmission line LNA, an output-side transmission line LNB, and unit circuits TU1 to TUn. An input terminal IN of the amplifier AMP2 is coupled to one end of the input-side transmission line LNA, and a terminating resistor RTA is coupled to the other end of the input-side transmission line LNA. A terminating resistor RTB1 is coupled to one end of the output-side transmission line LNB, and a terminating resistor RTB2 and an output terminal OUT of the amplifier AMP2 are coupled to the other end of the output-side transmission line LNB. A unit circuit TUi (i=1, 2, . . . , n) is formed of a transistor having a gate coupled to the input-side transmission line LNA, a source coupled to a ground line, and a drain coupled to the output-side transmission line LNB, and has no amplifying capability. For this reason, a plurality of numbers (n number) of unit circuits are coupled between the input-side transmission line LNA and the output-side transmission line LNB in order to obtain a desired gain by the entire amplifier.

In the distributed-constant-type amplifier with such a structure, the transmission line can be approximated by a ladder-type LC circuit, and a widening of the band realized by the transmission line can be expected. In a simple theory, by coupling n unit circuits, a gain of an amplifier is increased by n times, when compared with a case where one unit circuit is coupled. However, when the number of unit circuits is increased, a transmission line becomes long, resulting in that a loss in the transmission line becomes significant. Accordingly, a gain-frequency characteristic becomes the one in which a gain is gradually decreased from a low frequency side to a high frequency side, and it is difficult to realize a flatness of the gain-frequency characteristic. In the distributed-constant-type amplifier, a circuit design has to be made carefully by taking this point into consideration, otherwise the band is narrowed.

Note that as documents related to the embodiments, Japanese National Publication of International Patent Application No. 10-510970, S. Galal and B. Razavi, "40 Gb/s Amplifier and ESD Protection Circuit in 0.18 μm CMOS Technology," ISSCC Dig. Tech. Papers, pp. 480-481, February 2004, and the like can be cited.

As described above, the first example has a problem that there is a limit in widening the band when there is a need to gradually enlarge the driving capability of the unit circuits toward the rear stage of the circuits, and the second example has a problem that it is difficult to secure the flatness of the gain-frequency characteristic.

SUMMARY

According to an aspect of the embodiments, an amplifier is realized by a distributed-constant-type amplifier including an input-side transmission line and an output-side transmission line, and a plurality of unit circuits coupled between the input-side transmission line and the output-side transmission line, in which each of the plurality of unit circuits is formed by including an amplification circuit having a gain equal to or greater than one.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be described with reference to the drawings.

Figure 1A:
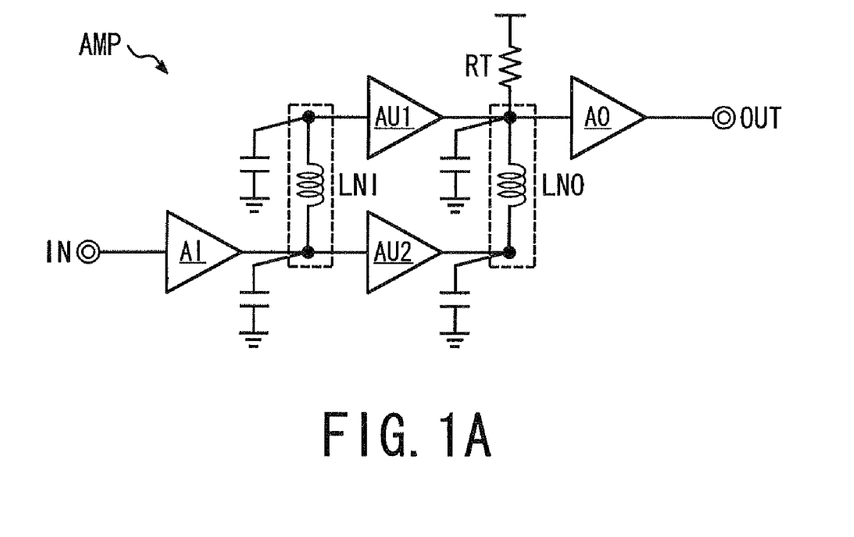
FIGS. 1A and 1B are explanatory diagrams illustrating a first embodiment.
Figure 1B:
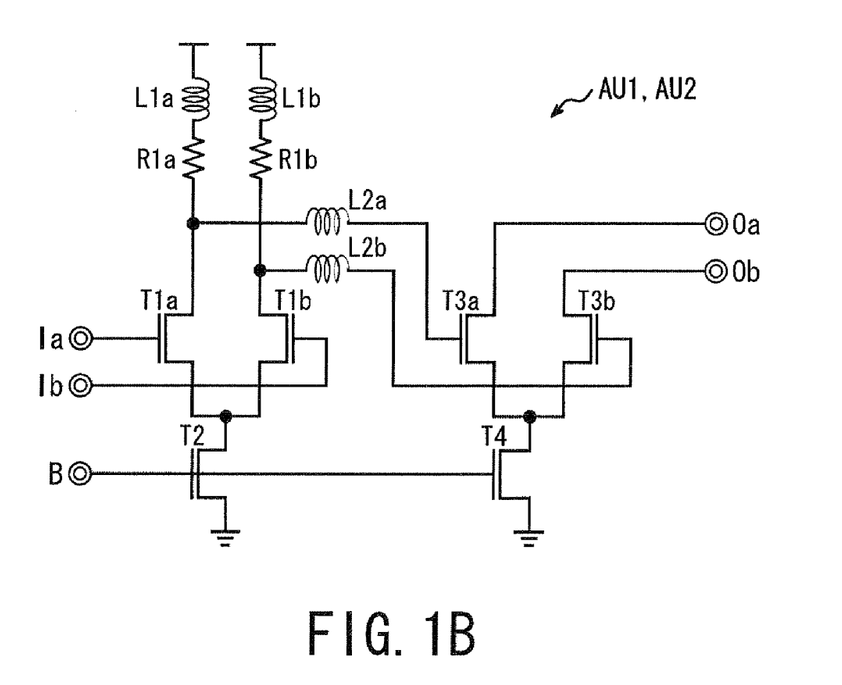

FIGS. 1A, 1B, and 1C illustrate a first embodiment. Note that FIG. 1A illustrates a structure of an amplifier of the first embodiment. FIG. 1B illustrates a structure of a unit circuit in the amplifier in FIG. 1A. As illustrated in FIG. 1A, in an amplifier AMP, an amplification circuit AI is coupled between an input terminal IN and one end of an input-side transmission line LNI, unit circuits AU1, AU2 are coupled between the input-side transmission line LNI and an output-side transmission line LNO, and an amplification circuit AO is coupled between one end of the output-side transmission line LNO and an output terminal OUT. To the one end of the output-side transmission line LNO, a terminating resistor RT is coupled. As illustrated in FIG. 1B, a unit circuit AUj (j=1, 2) corresponds to a unit circuit Ui (TRA-type differential amplification circuit) in FIG. 8 in which an open-drain-type amplification stage formed of differential pair transistors T3$a$, T3$b$, and a current source transistor T4 is inserted between inductors L2$a$, L2$b$ and output terminals Oa, Ob. In order to easily optimize peaking inductors L1$a$, L1$b$, L2$a$, L2$b$, sizes of the transistors T1$a$, T1$b$, T3$a$, T3$b$ are set to equalize capacitances of both ends of the inductors L2$a$, L2$b$ in the unit circuit AUj.

Figure 2:
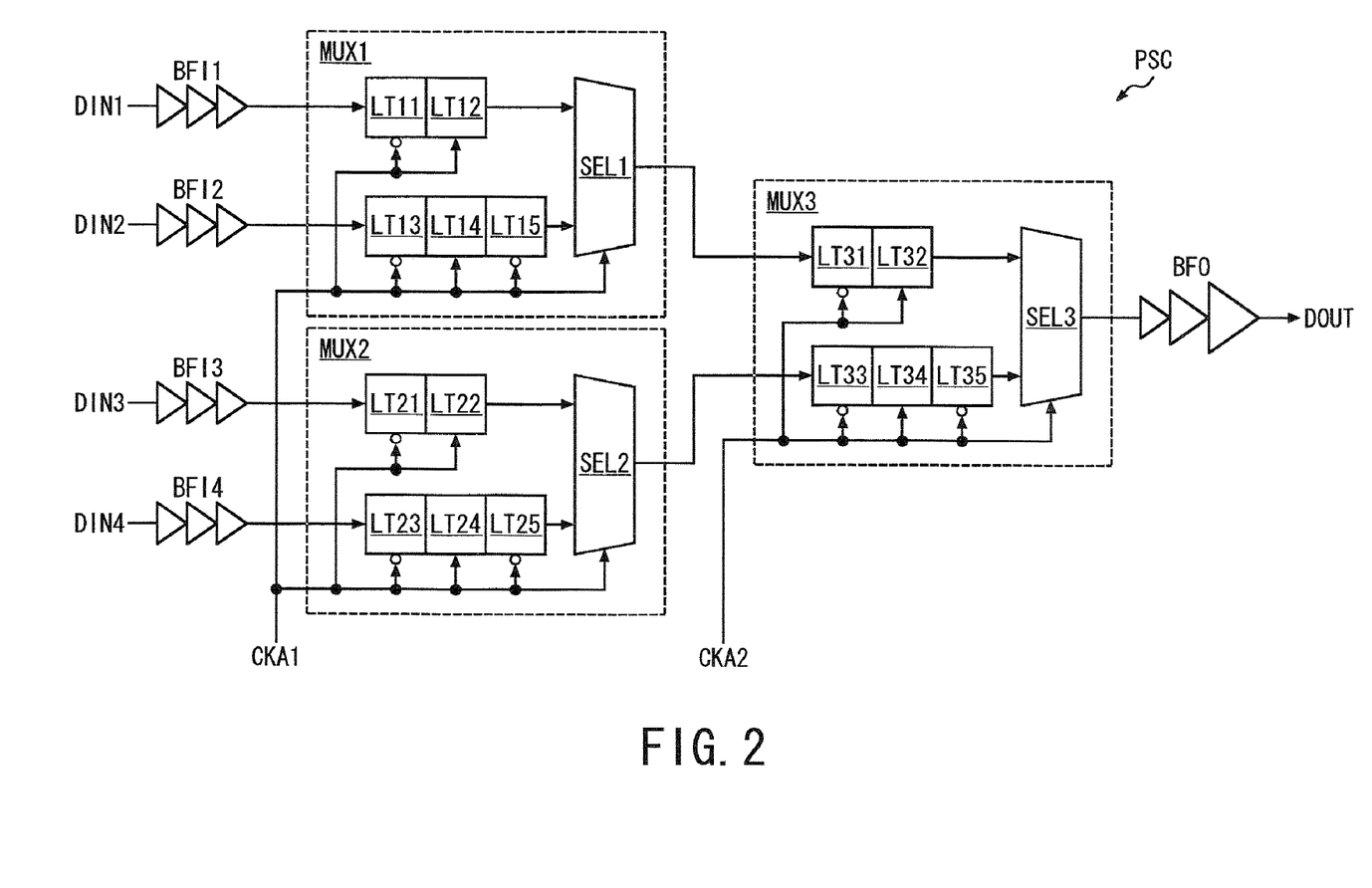
FIG. 2 is an explanatory diagram illustrating a first usage example of an amplifier in FIG. 1A.

FIG. 2 illustrates a first usage example of the amplifier in FIG. 1A. A parallel-to-serial conversion circuit PSC is a circuit that converts parallel data signals DIN1 to DIN4 (10 Gbps) into a serial data signal DOUT (40 Gbps), and is formed by including input buffers BF11 to BF14, multiplexers MUX1 to MUX3, and an output buffer BFO.

The input buffers BF11 to BF14 amplify and output the parallel data signals DIN1 to DIN4. For instance, the input buffers BF11 to BF14 are each formed by serially coupling three buffer circuits each having the same driving capability.

The multiplexer MUX1 is formed by including latches LT11 to LT15, and a selector SEL1. In synchronization with a falling transition of a clock signal CKA1 (10 GHz), the latch LT11 takes in an output data signal (10 Gbps) of the input buffer BF11 and outputs the signal. In synchronization with a rising transition of the clock signal CKA1, the latch LT12 takes in an output data signal of the latch LT11 and outputs the signal. In synchronization with the falling transition of the clock signal CKA1, the latch LT13 takes in an output data signal (10 Gbps) of the input buffer BF12 and outputs the signal. In synchronization with the rising transition of the clock signal CKA1, the latch LT14 takes in an output data signal of the latch LT13 and outputs the signal. In synchronization with the falling transition of the clock signal CKA1, the latch LT15 takes in an output data signal of the latch LT14 and outputs the signal. The selector SEL1 selects and outputs an output data signal of the latch LT12 when the clock signal CKA1 is set to a low level, and selects and outputs an output data signal of the latch LT15 when the clock signal CKA1 is set to a high level.

The multiplexer MUX2 is formed by including latches LT21 to LT25, and a selector SEL2. In synchronization with the falling transition of the clock signal CKA1, the latch LT21 takes in an output data signal (10 Gbps) of the input buffer BF13 and outputs the signal. In synchronization with the rising transition of the clock signal CKA1, the latch LT22 takes in an output data signal of the latch LT21 and outputs the signal. In synchronization with the falling transition of the clock signal CKA1, the latch LT23 takes in an output data signal (10 Gbps) of the input buffer BF14 and outputs the signal. In synchronization with the rising transition of the clock signal CKA1, the latch LT24 takes in an output data signal of the latch LT23 and outputs the signal. In synchronization with the falling transition of the clock signal CKA1, the latch LT25 takes in an output data signal of the latch LT24 and outputs the signal. The selector SEL2 selects and outputs an output data signal of the latch LT22 when the clock signal CKA1 is set to a low level, and selects and outputs an output data signal of the latch LT25 when the clock signal CKA1 is set to a high level.

The multiplexer MUX3 is formed by including latches LT31 to LT35, and a selector SEL3. In synchronization with a falling transition of a clock signal CKA2 (20 GHz), the latch LT31 takes in an output data signal (20 Gbps) of the selector SEL1 of the multiplexer MUX1 and outputs the signal. In synchronization with a rising transition of the clock signal CKA2, the latch LT32 takes in an output data signal of the latch LT31 and outputs the signal. In synchronization with the falling transition of the clock signal CKA2, the latch LT33 takes in an output data signal (20 Gbps) of the selector SEL2 of the multiplexer MUX2 and outputs the signal. In synchronization with the rising transition of the clock signal CKA2, the latch LT34 takes in an output data signal of the latch LT33 and outputs the signal. In synchronization with the falling transition of the clock signal CKA2, the latch LT35 takes in an output data signal of the latch LT34 and outputs the signal. The selector SEL3 selects and outputs an output data signal of the latch LT32 when the clock signal CKA2 is set to a low level, and selects and outputs an output data signal of the latch LT35 when the clock signal CKA2 is set to a high level.

The output buffer BFO amplifies an output data signal (40 Gbps) of the selector SEL3 of the multiplexer MUX3 and outputs the signal as the serial data signal DOUT. For instance, the output buffer BFO is formed by serially coupling three buffer circuits each having a different driving capability in an order in which the driving capability becomes larger toward a rear stage of the circuits.

In the parallel-to-serial conversion circuit PSC structured as above, the amplifier AMP in FIG. 1A is used as the output buffer BFO of the serial data signal DOUT.

Figure 3:
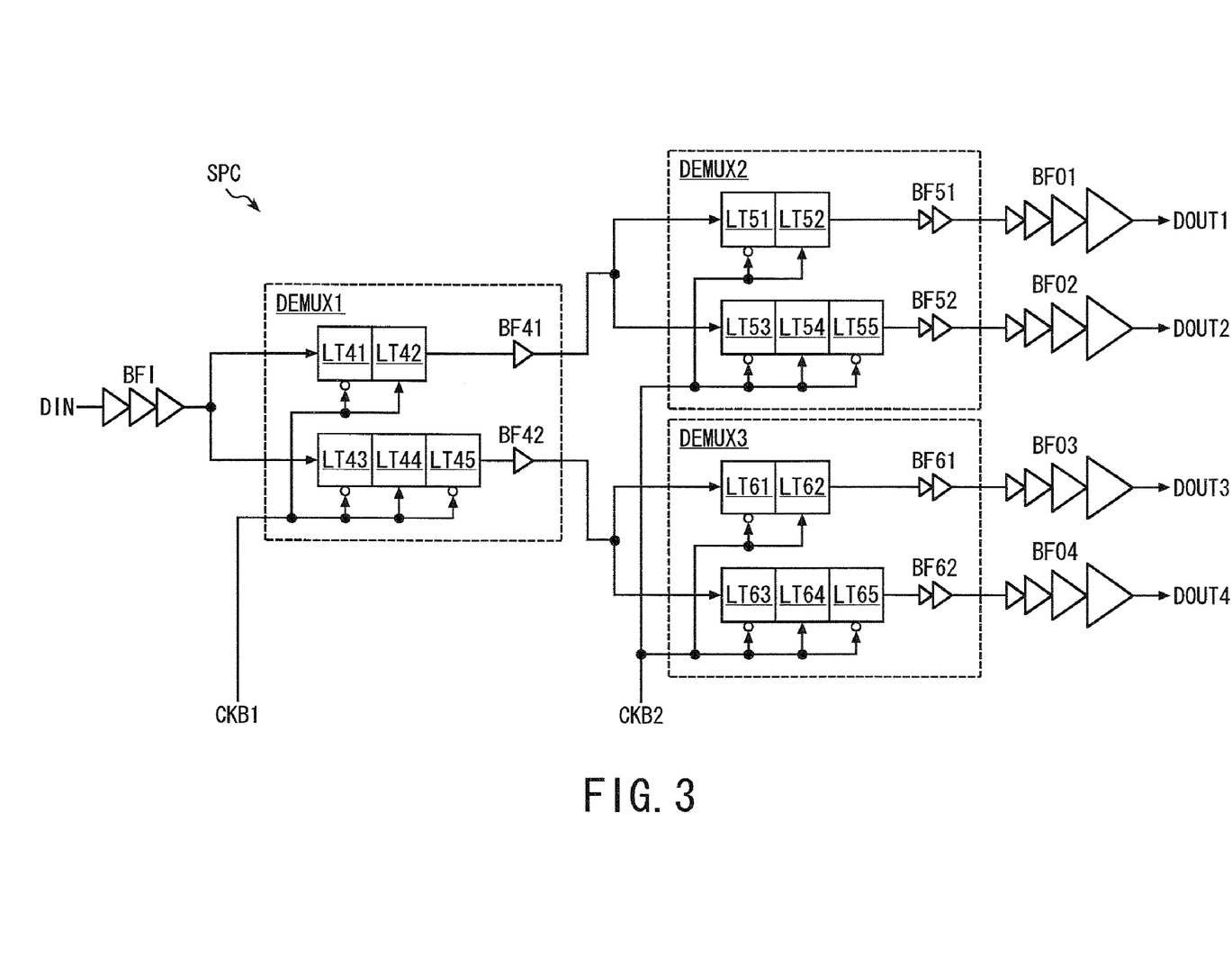
FIG. 3 is an explanatory diagram illustrating a second usage example of the amplifier in FIG. 1A.

FIG. 3 illustrates a second usage example of the amplifier in FIG. 1A. A serial-to-parallel conversion circuit SPC is a circuit that converts a serial data signal DIN (40 Gbps) into parallel data signals DOUT1 to DOUT4 (10 Gbps), and is formed by including an input buffer BFI, demultiplexers DEMUX1 to DEMUX3, and output buffers BFO1 to BFO4.

The input buffer BFI amplifies and outputs the serial data signal DIN. For instance, the input buffer BFI is formed by serially coupling three buffer circuits each having the same driving capability.

The demultiplexer DEMUX1 is formed by including latches LT41 to LT45, and buffers BF41, BF42. In synchronization with a falling transition of a clock signal CKB1 (20 GHz), the latch LT41 takes in an output data signal (40 Gbps) of the input buffer BFI and outputs the signal. In synchronization with a rising transition of the clock signal CKB1, the latch LT42 takes in an output data signal of the latch LT41 and outputs the signal. In synchronization with the falling transition of the clock signal CKB1, the latch LT43 takes in the output data signal of the input buffer BFI and outputs the signal. In synchronization with the rising transition of the clock signal CKB1, the latch LT44 takes in an output data signal of the latch LT43 and outputs the signal. In synchronization with the falling transition of the clock signal CKB1, the latch LT45 takes in an output data signal of the latch LT44 and outputs the signal. The buffers BF41, BF42 amplify and output output data signals of the latches LT42, LT45. For instance, the buffers BF41, BF42 are each formed of one buffer circuit.

The demultiplexer DEMUX2 is formed by including latches LT51 to LT55, and buffers BF51, BF52. In synchronization with a falling transition of a clock signal CKB2 (10 GHz), the latch LT51 takes in an output data signal (20 Gbps) of the buffer BF41 of the demultiplexer DEMUX1 and outputs the signal. In synchronization with a rising transition of the clock signal CKB2, the latch LT52 takes in an output data signal of the latch LT51 and outputs the signal. In synchronization with the falling transition of the clock signal CKB2, the latch LT53 takes in the output data signal of the buffer BF41 of the demultiplexer DEMUX1 and outputs the signal. In synchronization with the rising transition of the clock signal CKB2, the latch LT54 takes in an output data signal of the latch LT53 and outputs the signal. In synchronization with the falling transition of the clock signal CKB2, the latch LT55 takes in an output data signal of the latch LT54 and outputs the signal. The buffers BF51, BF52 amplify and output output data signals of the latches LT52, LT55. For instance, the buffers BF51, BF52 are each formed by serially coupling two buffer circuits each having a different driving capability in an order in which the driving capability becomes larger toward a rear stage of the circuits.

The demultiplexer DEMUX3 is formed by including latches LT61 to LT65, and buffers BF61, BF62. In synchronization with the falling transition of the clock signal CKB2, the latch LT61 takes in an output data signal (20 Gbps) of the buffer BF42 of the demultiplexer DEMUX1 and outputs the signal. In synchronization with the rising transition of the clock signal CKB2, the latch LT62 takes in an output data signal of the latch LT61 and outputs the signal. In synchronization with the falling transition of the clock signal CKB2, the latch LT63 takes in the output data signal of the buffer BF42 of the demultiplexer DEMUX1 and outputs the signal. In synchronization with the rising transition of the clock signal CKB2, the latch LT64 takes in an output data signal of the latch LT63 and outputs the signal. In synchronization with the falling transition of the clock signal CKB2, the latch LT65 takes in an output data signal of the latch LT64 and outputs the signal. The buffers BF61, BF62 amplify and output output data signals of the latches LT62, LT65. For instance, the buffers BF61, BF62 are each formed by serially coupling two buffer circuits each having a different driving capability in an order in which the driving capability becomes larger toward a rear stage of the circuits.

The output buffers BFO1 to BFO4 amplify output data signals (10 Gbps) of the buffers BF51, BF52 of the demultiplexer DEMUX2 and the buffers BF61, BF62 of the demultiplexer DEMUX3, and output the signals as the parallel data signals DOUT1 to DOUT4. For instance, the output buffers BFO1 to BFO4 are each formed by serially coupling four buffer circuits each having a different driving capability in an order in which the driving capability becomes larger toward a rear stage of the circuits.

In the serial-to-parallel conversion circuit SPC structured as above, the amplifier AMP in FIG. 1A is used as the input buffer BFI of the serial data signal DIN.

Figure 4:
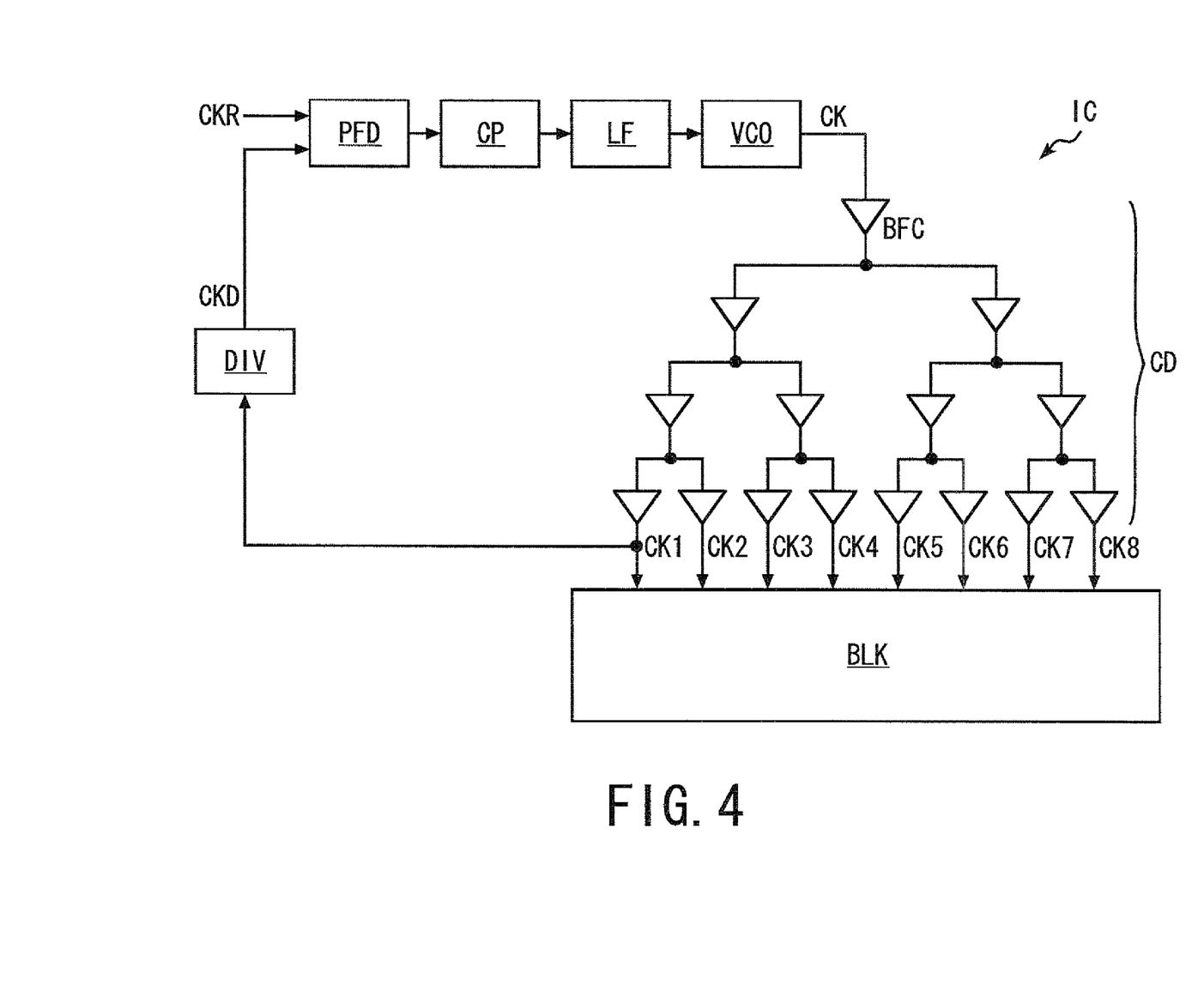
FIG. 4 is an explanatory diagram illustrating a third usage example of the amplifier in FIG. 1A.

FIG. 4 illustrates a third usage example of the amplifier in FIG. 1A. A semiconductor integrated circuit IC is formed by including a phase-frequency detector PFD, a charge pump CP, a loop filter LF, a voltage-controlled oscillator VCO, a clock distribution circuit CD, a circuit block BLK, and a frequency divider DIV.

The phase-frequency detector PFD detects a phase difference and a frequency difference of a reference clock signal CKR and a frequency-divided clock signal CKD. The charge pump CP charges and discharges a capacitor in the loop filter LF based on a detection result of the phase-frequency detector PFD. The loop filter LF smoothes a voltage obtained by the charge pump CP, and outputs the voltage as a control voltage for the voltage-controlled oscillator VCO. The voltage-controlled oscillator VCO generates a clock signal CK based on the control voltage supplied from the loop filter LF. The clock distribution circuit CD is formed by coupling fifteen clock buffers BFC in a tree structure, and generates clock signals CK1 to CK8 from the clock signal CK. The circuit block BLK realizes a processor function and the like, and operates by using the clock signals CK1 to CK8. The frequency divider DIV frequency-divides the clock signal CK1 and outputs the signal as the frequency-divided clock signal CKD.

In the semiconductor integrated circuit IC structured as above, the amplifier AMP in FIG. 1A is used as the clock buffer BFC that forms the clock distribution circuit CD.

Figure 5:
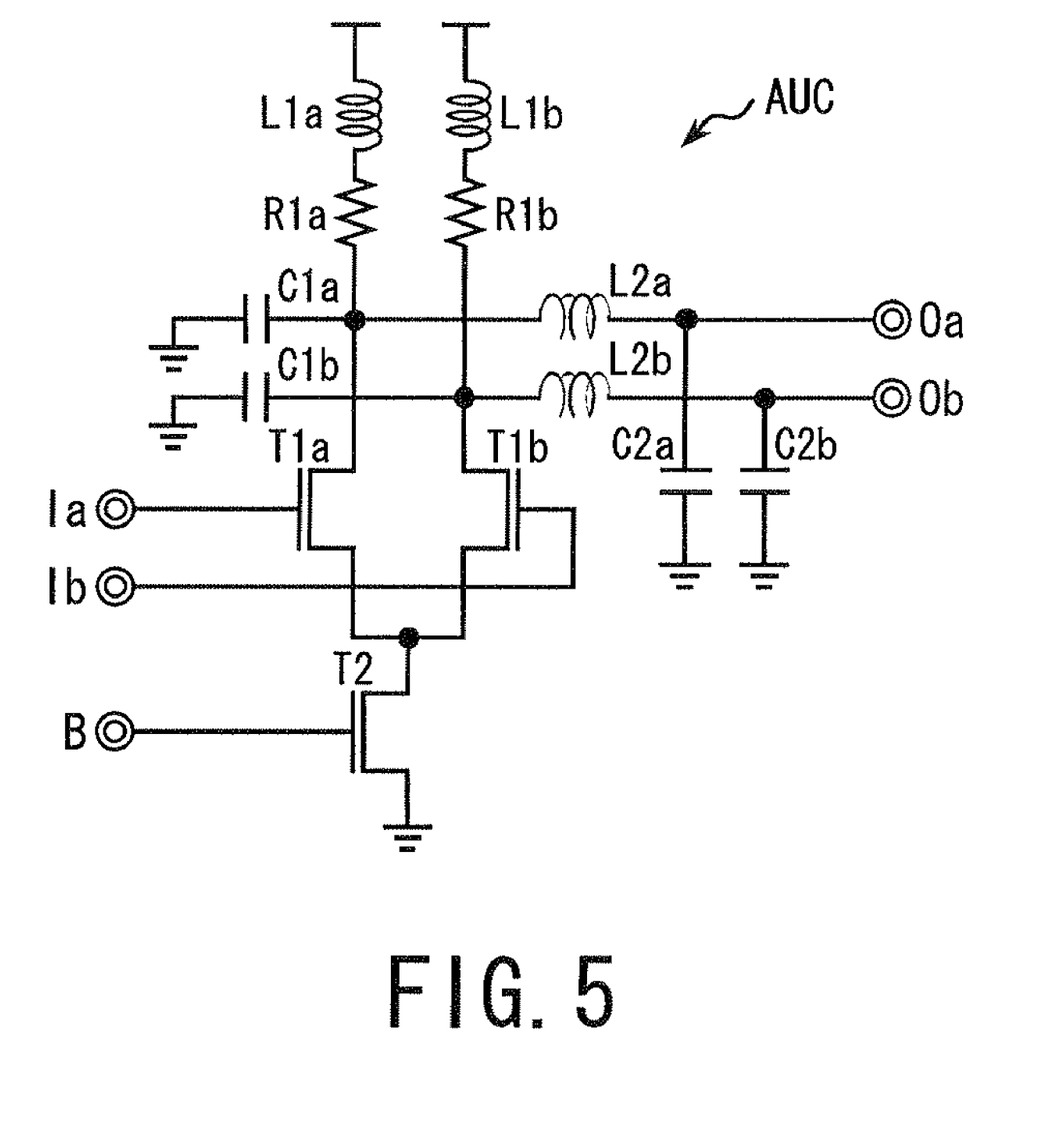
FIG. 5 is an explanatory diagram illustrating a comparative example of a unit circuit.

FIG. 5 illustrates a comparative example of the unit circuit. A unit circuit AUC corresponds to the unit circuit Ui (TRA-type differential amplification circuit) in FIG. 8 to which capacitors C1a, C2a of both ends of the inductor L2a and capacitors C1b, C2b of both ends of the inductor L2b are added. If it is supposed that the similar amplifier as the amplifier AMP in FIG. 1A is structured by using the unit circuit AUC, it is difficult to equalize the capacitances C1a, C1b, and the capacitances C2a, C2b in each of the unit circuits, resulting in that the flatness of the gain-frequency characteristic cannot be secured. Further, when the number of unit circuits is n, the DC gain is decreased to 1/n.

On the contrary, in the amplifier AMP structured by using the unit circuit AUj in FIG. 1B, the input-side amplification stage (amplification stage formed of the transistors T1a, T1b, T2, the resistors R1a, R1b, and the inductors L1a, L1b, L2a, L2b) in the unit circuit AUj can be easily optimized as the TRA-type differential amplification circuit, and further, the output-side amplification stage (amplification stage formed of the transistors T3a, T3b, T4) can be coupled to the output-side transmission line LNO, similarly as in the conventional unit circuit (the unit circuit TUi in FIG. 10). Further, even when the number of unit circuits is n, no decrease in the DC gain occurs.

Figure 6A:
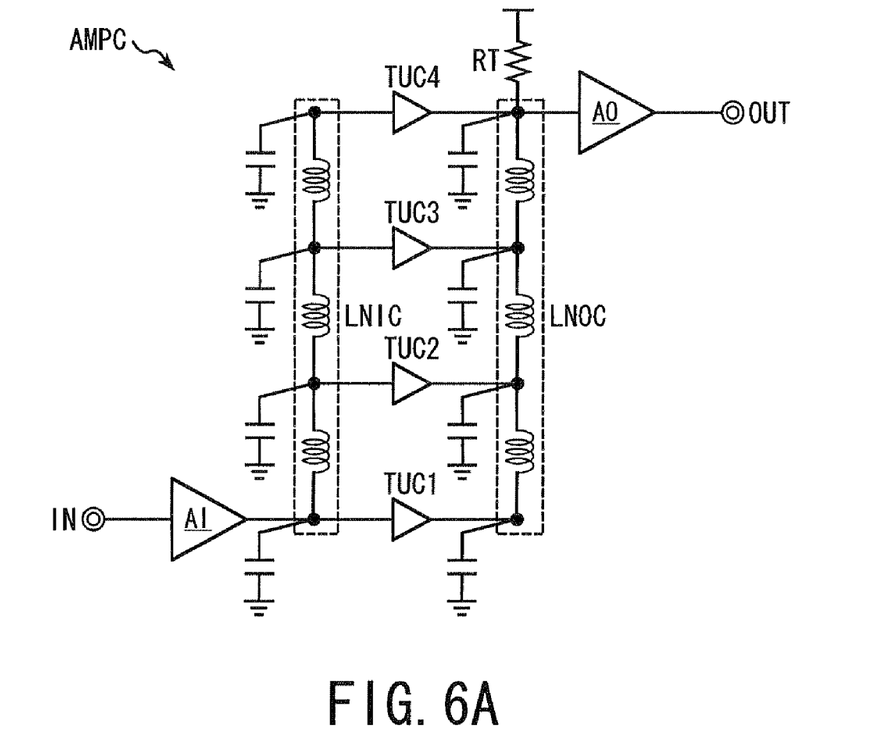
FIGS. 6A and 6B are explanatory diagrams illustrating an effectiveness of the first embodiment.
Figure 6B:
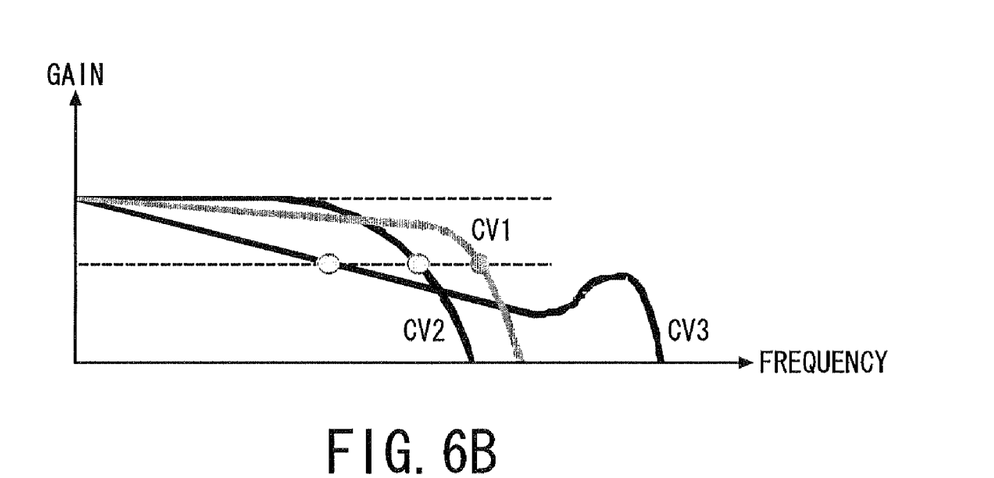

FIGS. 6A and 6B illustrate an effectiveness of the first embodiment. Note that FIG. 6A illustrates a comparative example of the amplifier. FIG. 6B illustrates gain-frequency characteristics of the amplifier in FIG. 1A, an amplifier in FIG. 6A, and an amplifier using the TRA-type differential amplification circuit. In FIG. 6B, a characteristic curve CV1 corresponds to the gain-frequency characteristic of the amplifier AMP in FIG. 1A, a characteristic curve CV2 corresponds to the gain-frequency characteristic of an amplifier AMPC in FIG. 6A, and a characteristic curve CV3 corresponds to the gain-frequency characteristic of an amplifier using the TRA-type differential amplification circuit.

The amplifier AMPC in FIG. 6A is formed as the same amplifier as the amplifier AMP in FIG. 1A in which a unit circuit (which corresponds to the unit circuit TUi in FIG. 10) formed only of the open-drain-type amplification stage is used. In the amplifier AMPC, unit circuits TUC1 to TUC4 are coupled between an input-side transmission line LNIC and an output-side transmission line LNOC, and the number of unit circuits required to obtain a desired gain by the entire amplifier is four. Meanwhile, in the amplifier AMP in FIG. 1A, the unit circuit is formed by including the TRA-type differential amplification circuit having a gain equal to or greater than one, so that the number of unit circuits required to obtain a desired gain by the entire amplifier is two. As above, in the amplifier AMP of the first embodiment, it is possible to reduce the number of unit circuits required to obtain a desired gain by the entire amplifier, when compared with the amplifier AMPC. Accordingly, the transmission lines can be shortened, which enables to easily avoid a problem regarding the flatness of the gain-frequency characteristic in designing the distributed-constant-type amplifier. When FIG. 6B is referred to, it can be understood that the amplifier AMP of the first embodiment provides a higher gain and a wider band than the other amplifiers.

Figure 7:
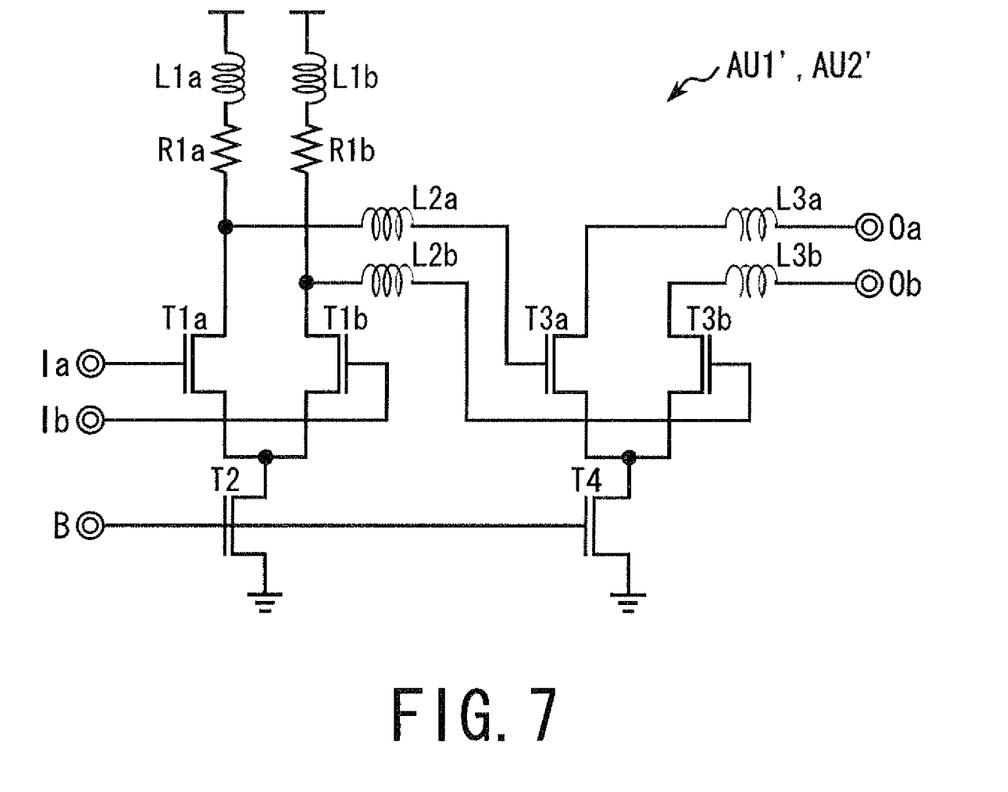
FIG. 7 is an explanatory diagram illustrating a second embodiment.

FIG. 7 illustrates a second embodiment. An amplifier of the second embodiment corresponds to the amplifier AMP in FIG. 1A in which the unit circuit AUj (j=1, 2) is replaced with a unit circuit AUj'. The unit circuit AUj' corresponds to the unit circuit AUj in FIG. 1B in which inductors L3a, L3b are inserted between the transistors T3a, T3b, and the output terminals Oa, Ob. Note that the amplifier of the second embodiment is used, similar to the amplifier AMP of the first embodiment, as the output buffer BFO in the parallel-to-serial conversion circuit PSC in FIG. 2, the input buffer BFI in the serial-to-parallel conversion circuit SPC in FIG. 3, or the clock buffer BFC that forms the clock distribution circuit CD in the semiconductor integrated circuit IC in FIG. 4.

In the second embodiment as described above, it is possible not only to obtain the similar effect as the first embodiment but also to obtain an effect of improving design flexibility of the output-side transmission line LNO since the inductors L3a, L3b are inserted between the transistors T3a, T3b and the output terminals Oa, Ob in the unit circuit AUj'.

Note that in the first and second embodiments, the unit circuit is formed of two amplification stages (the input-side amplification stage and the output-side amplification stage), but, the unit circuit can also be formed of three or more amplification stages.

A proposition of the aforementioned embodiments is to realize an amplifier that provides a high gain and a wide band.

According to an aspect of the embodiments, an amplifier is realized by a distributed-constant-type amplifier including an input-side transmission line and an output-side transmission line, and a plurality of unit circuits coupled between the input-side transmission line and the output-side transmission line, in which each of the plurality of unit circuits is formed by including an amplification circuit having a gain equal to or greater than one.

For example, each of the plurality of unit circuits is formed by coupling a plurality of amplification stages. For instance, each of the plurality of unit circuits is formed by coupling an input-side amplification stage coupled to the input-side transmission line and an output-side amplification stage coupled to the output-side transmission line, in which the input-side amplification stage is an amplification circuit using a peaking inductor. For example, the output-side amplification stage is formed by providing an inductor at a front stage of a connection node of the output-side amplification stage and the output-side transmission line.

In the amplifier having a structure as described above, each of the plurality of unit circuits is formed by including the amplification circuit having a gain equal to or greater than one, so that it is possible to obtain a gain to be required by the entire amplifier with a small number of unit circuits. For this reason, the input-side transmission line and the output-side transmission line can be shortened, resulting in that a flatness of a gain-frequency characteristic can be easily secured. Therefore, it is possible to easily realize the amplifier that provides a high gain and a wide band.

The embodiments are useful when applied to an amplifier used to perform amplification or transmission of high-speed data signals and clock signals in an analog LSI, a digital LSI, or a mixed signal LSI (analog-digital mixed LSI).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifier being a distributed-constant-type amplifier comprising
   an input-side transmission line and an output-side transmission line, and
   a plurality of unit circuits coupled between the input-side transmission line and the output-side transmission line, wherein
   each of the plurality of unit circuits comprises an amplification circuit having a gain equal to or greater than one,
   wherein each of the plurality of unit circuits includes an input-side amplification stage coupled to the input-side transmission line, an output-side amplification stage coupled to the output-side transmission line and first inductors provided between the input-side amplification stage and the output-side amplification stage,
   wherein the output-side amplification stage includes differential pair transistors, which is inserted between the first inductors and output terminals of the output-side amplification stage respectively, and a current source transistor coupled to the differential pair transistors, and
   wherein each of the first inductors is coupled to a gate of each of the differential pair transistors, respectively.

2. The amplifier according to claim 1, wherein
   the amplification circuit is an amplification circuit using a peaking inductor.

3. The amplifier according to claim 1, wherein
   each of the plurality of unit circuits is formed by coupling a plurality of amplification stages.

4. The amplifier according to claim 1, wherein
   the input-side amplification stage is an amplification circuit using a peaking inductor.

5. The amplifier according to claim 1, wherein
   the amplifier is used as an output buffer of a serial data signal in a parallel-to-serial conversion circuit which converts parallel data signals into the serial data signal.

6. The amplifier according to claim 1, wherein
   the amplifier is used as an input buffer of a serial data signal in a serial-to-parallel conversion circuit which converts the serial data signal into parallel data signals.

7. The amplifier according to claim 1, wherein
   the amplifier is used as a clock buffer in a clock distribution circuit which generates a plurality of output clock signals from an input clock signal.

8. The amplifier according to claim 1, wherein
   the output-side amplification stage includes second inductors provided between the differential pair transistors and the output terminals respectively.

9. The amplifier according to claim 1, wherein
   capacitances of differential pair transistors coupled to both ends of each of the first inductors are equal.

* * * * *